United States Patent [19]

Dürr

[11] 4,337,415
[45] Jun. 29, 1982

[54] HIGH FREQUENCY INDUCTIVE GENERATOR FOR THE INDUCTIVE COIL OF A PLASMA GENERATOR

[75] Inventor: René Dürr, Albertville, France

[73] Assignee: Instruments S.A., Paris, France

[21] Appl. No.: 164,024

[22] Filed: Jun. 30, 1980

[30] Foreign Application Priority Data

Jul. 4, 1979 [FR] France ............................. 79 17359

[51] Int. Cl.³ ........................................... H05H 1/46
[52] U.S. Cl. ................................. 315/111.51; 331/96; 356/316
[58] Field of Search .......................... 315/111.5, 248; 356/316; 331/96, 99, 100; 313/231.4, 234; 328/216, 221

[56] References Cited

U.S. PATENT DOCUMENTS 3,467,471 9/1969 Greenfield et al. .......... 315/111.5 X
3,958,883 5/1976 Turner ............................. 356/316

FOREIGN PATENT DOCUMENTS 307437 6/1971 U.S.S.R. ............................ 315/111.5

OTHER PUBLICATIONS

Abdallah et al., *Étude Spectrométrique D'un Plasma Induit par Haute Fréquence*, Analytica Chimica Acta 84 (1976), 271-282.

Primary Examiner—Eugene R. LaRoche
Attorney, Agent, or Firm—Pollock, Vande Sande & Priddy

[57] ABSTRACT

High frequency inductive generator for the inductive coil of a plasma generator constituted by a head for inflow of gas into an inductive coil. The high frequency generator has a quarter wave anode resonant line oscillator circuit and a coupling circuit connected to the inductive coil. The quarter wave anode circuit is controlled from a single oscillator tube. One of the lines is connected to the anode of the tube, while the other is coupled exteriorly by capacitive coupling.

The invention is used for analysis by emission spectrometry.

3 Claims, 3 Drawing Figures

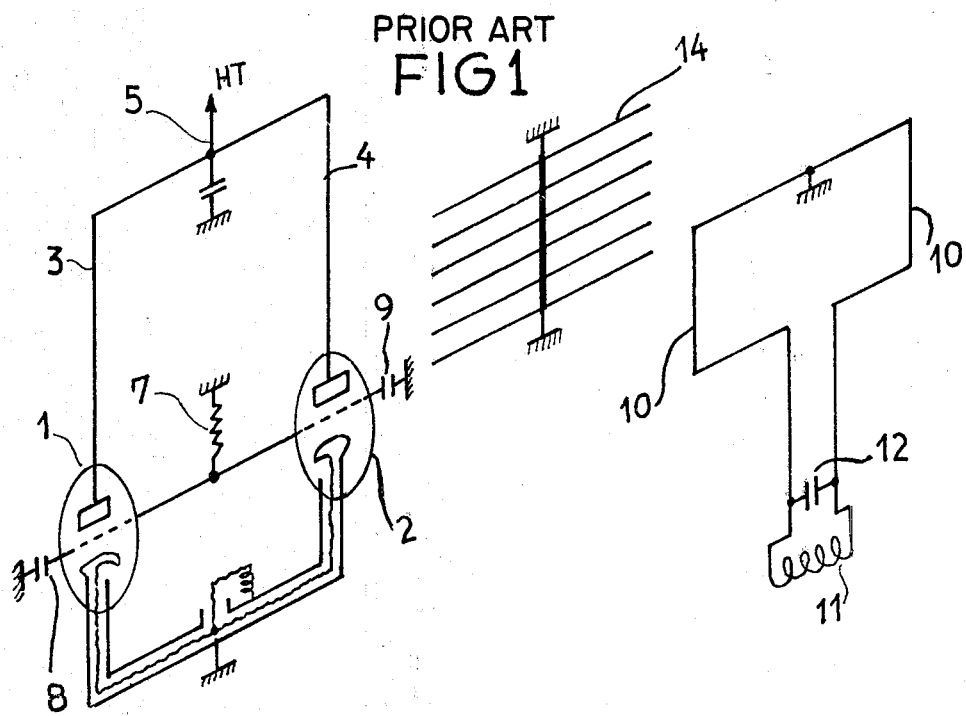
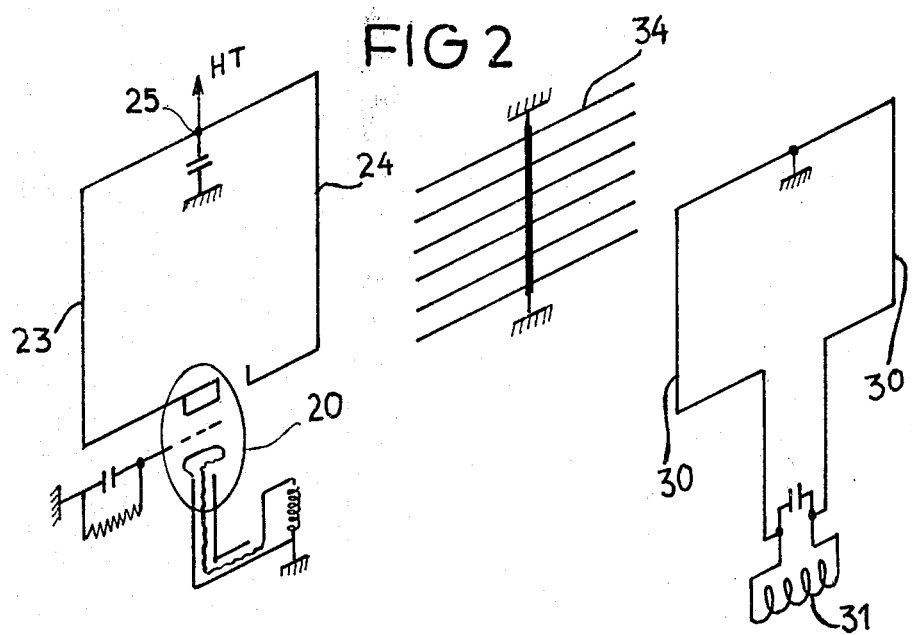

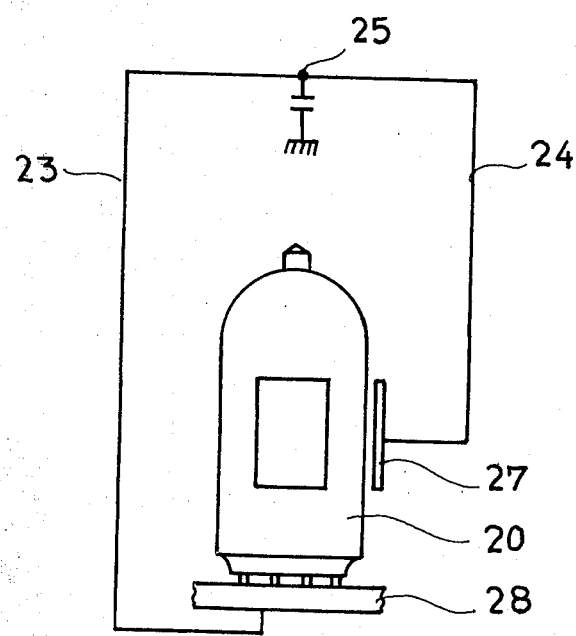

HIGH FREQUENCY INDUCTIVE GENERATOR FOR THE INDUCTIVE COIL OF A PLASMA GENERATOR

BACKGROUND OF THE INVENTION

The present invention concerns high frequency inductive generator for the inductive coil of a plasma generator intended more particularly for analyses by emission spectrometry, to produce a plasma flame from a gas jet, with an aerosol of the solution to be analyzed being introduced into this flame.

There is a known method of obtaining a plasma flame consisting in introducing a jet of gas such as argon into an inductor coil supplied at very high frequency, of the order for example of 40 to 60 MHz. The high frequency generator is therefore a fundamental element of an apparatus for analysis by emission spectrometry with inductive plasma.

Such an HF generator must be able to be connected to a very high impedance during the short period between starting and the ignition of the flame, and must then adapt automatically to a low impedance on ignition, and therefore present a very high surge coefficient.

Such HF generators have been made, with an oscillator of the resonant line type for forming plasma, or for other applications necessitating the use of high frequencies. According to this technique, represented diagrammatically by FIG. 1, two identical triodes 1 and 2 are used whose quarter wave anode lines 3 and 4 are connected at 5 where the high voltage is applied, of the order for example of 3,000 to 5,000 volts. The cathode lines of the two tubes are also coupled, like the grids provided with a resistor 7 and with decoupling capacitors 8 and 9. The lines 10 for the inductor 11 are connected by a capacitor 12. To suppress the static component of the coupling and pick up only the magnetic component, a screen 14 formed by a series of open dipoles is disposed between the loop of the anode lines 3 and 4 and the loop of coupling lines 10. A more complete study of such a generator can be found in an article published in 1976, pages 271 to 282 in number 84 of the journal "Analytica Chimica Acta".

Such a high frequency generator works entirely correctly as long as the tubes 1 and 2 have identical characteristics, which can be obtained with new, matched tubes, or if they both age in entirely parallel ways. In practice, this is rarely the case, and the differential aging of the two tubes leads to unbalancing of the circuits, by displacement of the zero point of the high frequency which causes serious distances in the operation of the generator. Moreover, the bulk of the two tubes and their supplies and attached members quickly becomes excessive when significant power levels are concerned.

SUMMARY OF THE INVENTION

The present invention allows the advantages of a quarter wave resonant line generator to be retained, while eliminating the disadvantages of the uncertain aging of the oscillator tubes. It also allows an HF generator to be made which is lighter and less bulky.

The invention therefore applies to a plasma generator, constituted by a head for inflow of gas to be ionized in an inductive coil, and a high frequency inductive generator having an oscillator tube circuit of the quarter wave anode resonant line type and a coupling circuit connected to the inductor coil. According to the invention the quarter wave anode circuit is controlled from a single oscillator tube, one of the extremities of the circuit from the zero point of the high frequency being connected to the anode of this tube, the other being coupled exteriorly to this same anode by capacitive coupling.

BRIEF DESCRIPTION OF THE DRAWINGS

To illustrate the invention, reference is made to the accompanying drawings, wherein:

FIG. 1 is a schematic representation of a prior art HF generator;

FIG. 2 represents, by way of example, and under the same conditions as FIG. 1, the diagram of an HF generator according to the invention; and FIG. 3 shows an example of capacitive coupling to the anode.

DETAILED DESCRIPTION OF AN EMBODIMENT

Here the quarter wave lines 23 and 24, connected at 25 to the high voltage, are associated with a single triode 20 whose cathode supply is in conformity with that of the two triode apparatus. The line 23 is connected in known manner to the anode of the tube 20. The other line 24 is coupled to this same anode by a capacitive coupling. FIG. 3 shows one example of such a capacitive coupling, where the line 24 is connected to a conductive plate 27 outside the tube, the glass envelope of the oscillator tube 20 serving as dielectric. The line 23 is connected normally, through the support 28, to the pin connected to the anode of the tube.

The loop of the coupling lines 30 for the inductor 31 is realized in a manner equivalent to that of FIG. 1, and a screen 34 can be used in the same way to eliminate the static component, and to re-establish perfect symmetry in the loop 30.

A resonant line HF generator is thus realized, presenting exactly the same characteristics as that of FIG. 1, but using a single oscillator tube. As a result there is clearly a reduction in bulk, weight and cost of setting up, but the most significant advantage is the permanence and stability in time of the characteristics of the generator since, once tuned, the circuits can no longer be unbalanced as a result of the aging of the oscillator tube.

What is claimed is:

1. High frequency inductive generator for the inductive coil of a plasma generator constituted by a head for inflow of gas to be ionized in an inductive coil, said high frequency inductive generator having an oscillator tube circuit of the quarter wave anode resonant line type and a coupling circuit connected to said inductor coil, wherein said quarter wave anode circuit is controlled from a single oscillator tube, one of the extremities of the circuit from the zero point of the high frequency being connected to the anode of this tube, the other being coupled exteriorly to said anode by capacitive coupling.

2. High frequency inductive generator according to claim 1, wherein said capacitive coupling is realized by means of a conductive plate outside said oscillator tube, the glass envelope of said tube being used as dielectric.

3. High frequency inductive generator according to claim 1 or 2, comprising a screen formed by a series of open dipoles between said anode circuit and said coupling circuit.

* * * * *